United States Patent
Dona et al.

(10) Patent No.: US 11,773,905 B2
(45) Date of Patent: Oct. 3, 2023

(54) AXIAL ALIGNMENT ASSEMBLY, AND CHARGED PARTICLE MICROSCOPE COMPRISING SUCH AN ALIGNMENT ASSEMBLY

(71) Applicant: FEI Company, Hillsboro, OR (US)

(72) Inventors: Pleun Dona, Eindhoven (NL); Casper Maria Smit, Eindhoven (NL)

(73) Assignee: FEI Company, Hillsboro, OR (US)

( * ) Notice: Subject to any disclaimer, the term of this patent is extended or adjusted under 35 U.S.C. 154(b) by 20 days.

(21) Appl. No.: 17/325,946

(22) Filed: May 20, 2021

(65) Prior Publication Data
US 2021/0366684 A1    Nov. 25, 2021

(30) Foreign Application Priority Data
May 20, 2020    (EP) .................................. 20175865

(51) Int. Cl.
*F16C 33/76*    (2006.01)
*H01J 37/15*    (2006.01)

(52) U.S. Cl.
CPC .......... *F16C 33/768* (2013.01); *F16C 33/761* (2013.01); *H01J 37/15* (2013.01); *H01J 2237/1415* (2013.01)

(58) Field of Classification Search
CPC .......... H01J 37/10; H01J 37/141; H01J 37/15; F16C 33/761
See application file for complete search history.

(56) References Cited

U.S. PATENT DOCUMENTS

| | | | |
|---|---|---|---|
| 4,434,962 A | 3/1984 | Bleuel et al. | |
| 4,730,138 A | 3/1988 | Wladimiroff | |
| 2006/0249687 A1 | 11/2006 | Chao et al. | |
| 2009/0039280 A1* | 2/2009 | Adamec | H01J 37/141 |
| | | | 29/602.1 |

FOREIGN PATENT DOCUMENTS

| | | |
|---|---|---|
| GB | 1209566 | 10/1970 |
| JP | S5826439 | 2/1983 |
| JP | 2000315471 | 11/2000 |

OTHER PUBLICATIONS

Anonymous, 6 mm Goldstecker, Nov. 11, 2004, web site address: http://nessel-electronik.de.Goldstecker/6_mm_Goldstecker/6_mm_goldstecker.html.
EP Search Report for Application No. 20175865.3, dated Jan. 11, 2021, in the corresponding EP application.

\* cited by examiner

*Primary Examiner* — Eliza W Osenbaugh-Stewart

(57) ABSTRACT

An axial alignment assembly (100) comprising a first body and a second body. The first body has a substantially cylindrical outer jacket, and has a first alignment axis. The second body comprises a substantially cylindrical inner jacket, and has a second alignment axis. The second body is positioned with respect to said first body in so that said inner jacket faces said outer jacket and in between said inner jacket and said outer jacket a substantially annular recess is formed. The axial alignment assembly further comprises a plurality of resilient elements that are positioned within said annular recess, wherein each resilient element is in contact with said outer jacket of said first body and with said inner jacket of said second body. Each resilient element exerts a force onto said outer jacket and onto said inner jacket for aligning said first alignment axis and said second alignment axis.

18 Claims, 5 Drawing Sheets

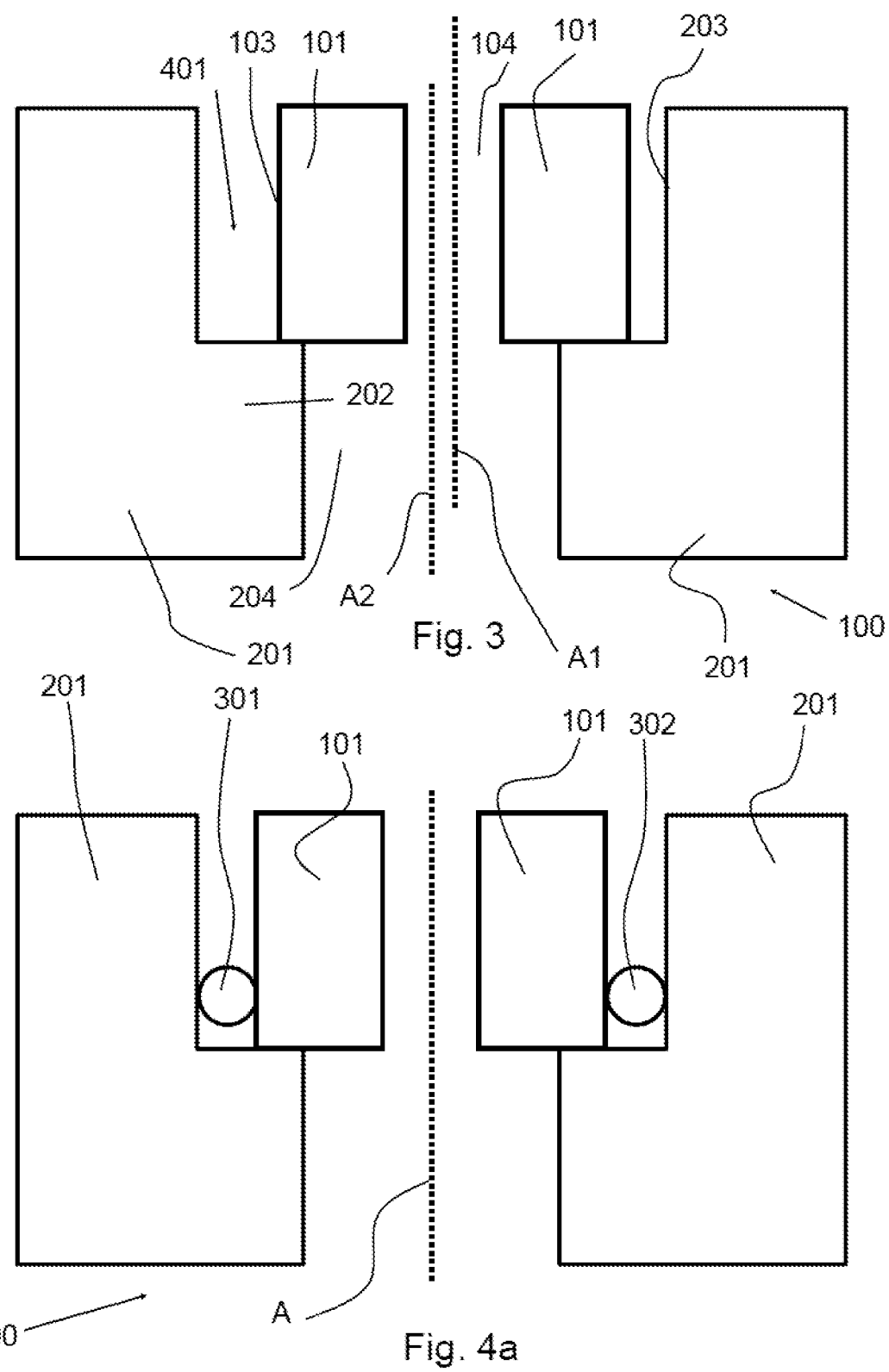

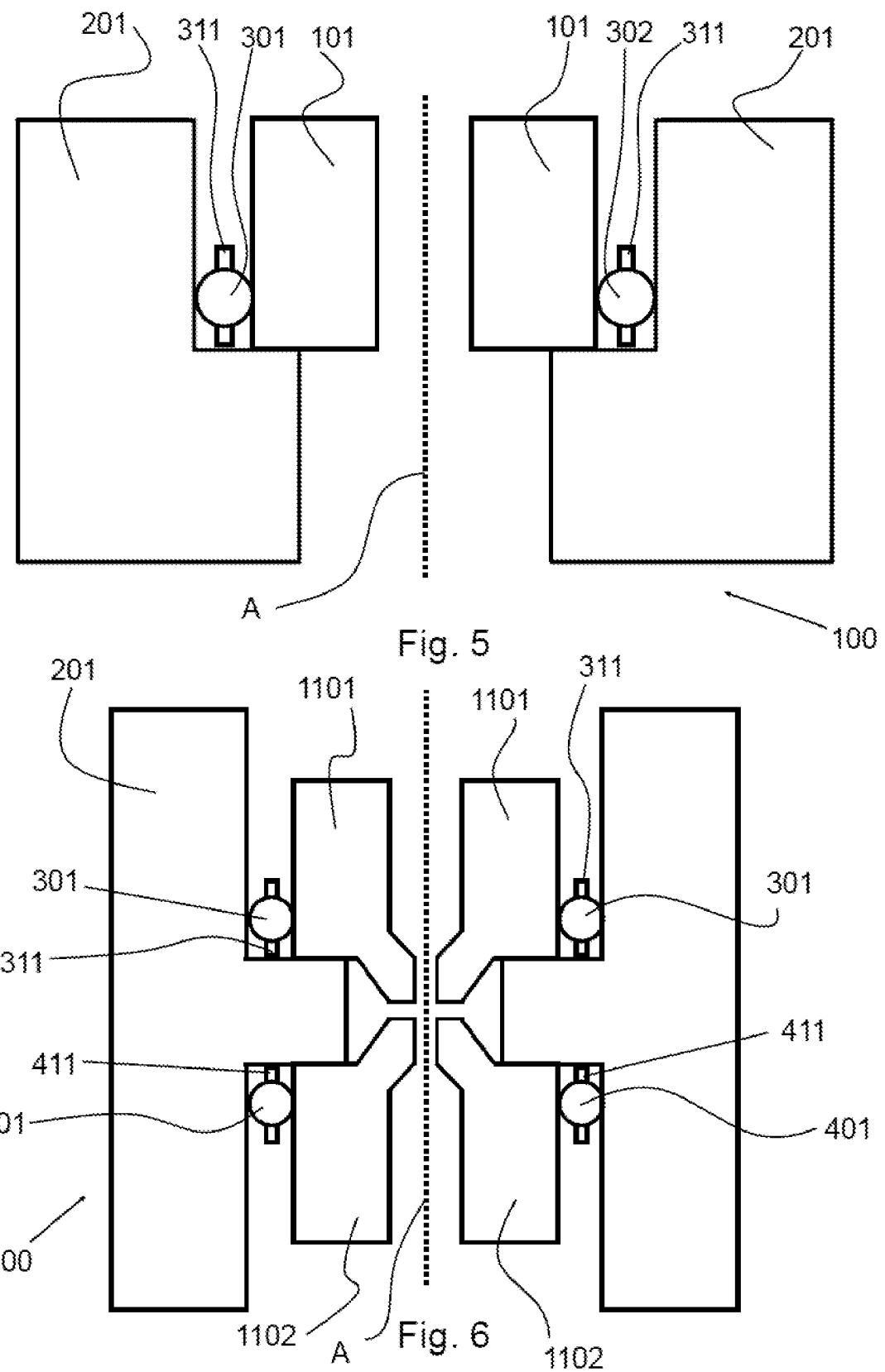

AXIAL ALIGNMENT ASSEMBLY, AND CHARGED PARTICLE MICROSCOPE COMPRISING SUCH AN ALIGNMENT ASSEMBLY

FIELD OF THE INVENTION

The present description relates to an axial alignment assembly, comprising a first body with a first axial alignment axis, and a second body having a second axial alignment axis, and wherein the axial alignment assembly is arranged for aligning said first and second axial alignment axis substantially onto each other.

The present description also relates to a charged particle microscope comprising such an axial alignment assembly.

BACKGROUND OF THE INVENTION

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. The skilled person will be familiar with the different species of charged particle microscopy.

In a SEM, irradiation of a sample by a scanning electron beam precipitates emanation of "auxiliary" radiation from the sample, in the form of secondary electrons, backscattered electrons, X-rays and cathodoluminescence (infrared, visible and/or ultraviolet photons). One or more components of this emanating radiation may be detected and used for sample analysis.

In TEM, a beam of electrons is transmitted through a specimen to form an image from the interaction of the electrons with the sample as the beam is transmitted through the specimen. The image is then magnified and focused onto an imaging device, such as a fluorescent screen, a layer of photographic film, or a sensor such as a scintillator attached to a charge-coupled device (CCD). The scintillator converts primary electrons in the microscope to photons so that the CCD is able to detect it.

Charged particle microscopes comprise a number of modules that need to be accurately aligned with respect to a common axial alignment axis. This common axial alignment axis often is the electron-optical axis. The modules that need to be accurately aligned include optical modules, such electromagnetic lenses, in particular pole pieces of these electromagnetic lenses. The required tolerance for aligning an upper pole piece and a lower pole piece, for example, may be in the order of magnitude of 1 µm. These strict tolerances are sometimes required in other mechanical systems as well.

It is an object of the present disclosure to provide an axial alignment assembly that provides these required tolerances, or at least improves existing axial alignment assemblies. In particular, it is an object to provide an improved charged particle microscope by incorporating such an axial alignment assembly.

SUMMARY

In one embodiment, an axial alignment assembly comprises a first body comprising a substantially cylindrical outer jacket, and having a first alignment axis; a second body comprising a substantially cylindrical inner jacket, and having a second alignment axis, wherein said second body is positioned with respect to said first body in such a way that said inner jacket faces said outer jacket and in between said inner jacket and said outer jacket a substantially annular recess is formed; and a plurality of resilient elements that are positioned within said annular recess, wherein each resilient element is in contact with said outer jacket of said first body and with said inner jacket of said second body and exerts a force onto said outer jacket and onto said inner jacket for aligning said first alignment axis and said second alignment axis. In this way, the first body and second body can be aligned accurately along the common axial alignment axis.

BRIEF DESCRIPTION OF THE DRAWINGS

FIG. 3—a longitudinal cross-sectional view through a first body and a second body of the axial assembly as defined herein;

FIG. 4*a*—a longitudinal cross-sectional view through an axial assembly as defined herein;

FIG. 4*b*—a close up view of the axial assembly of FIG. 4*a*;

FIG. 5—an embodiment of the axial assembly as defined herein;

FIG. 6—a further embodiment of the axial assembly as defined herein, in particular in use for a charged particle microscope.

DETAILED DESCRIPTION

Figure 1:
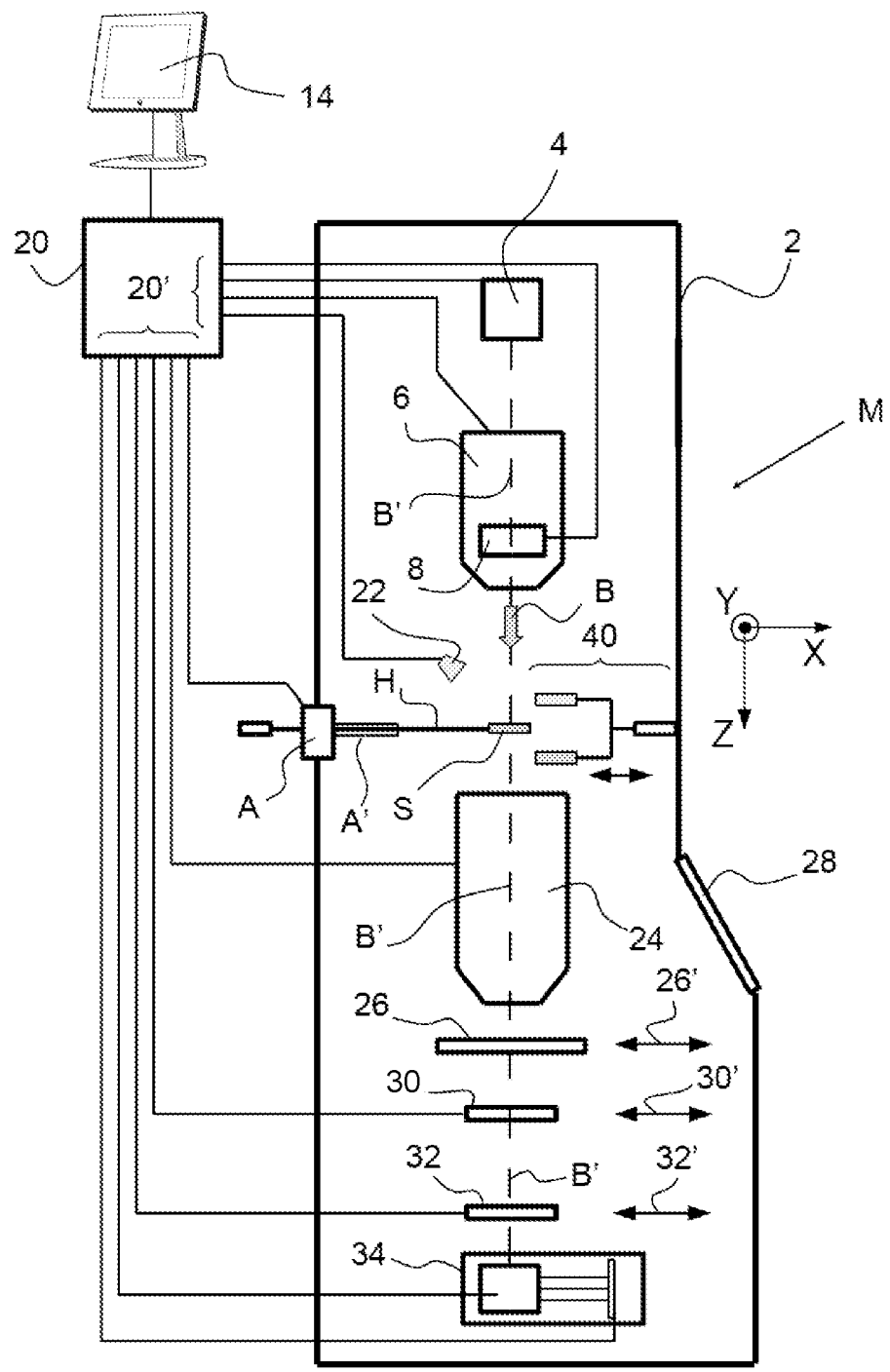
FIG. 1—shows a longitudinal cross-sectional view of a charged particle microscope according to a first embodiment of the invention.

The following description relates to an axial alignment assembly and a method for aligning a first body and a second body. The axial alignment assembly as defined herein comprises a first body comprising a substantially cylindrical outer jacket. The first body comprises a first alignment axis. The first alignment axis generally corresponds to the longitudinal axis of the cylinder defined by said cylindrical outer jacket. The first body may, for example, be an optical module of a charged particle microscope, such as a pole piece of an electromagnetic lens. The first body may comprise a hollow bore that is centered with respect to the first alignment axis. Other embodiments of the first body are conceivable as well of course.

As defined herein, the axial alignment assembly comprises a second body that comprises a substantially cylindrical inner jacket. The second body comprises a second alignment axis. The second alignment axis generally corresponds to the longitudinal axis of the (virtual) cylinder defined by said cylindrical inner jacket. Said second body is positioned with respect to said first body in such a way that said inner jacket of said first body faces said outer jacket of said second body. In other words, the first body is at least partly positioned within a cylindrical gap defined by said virtual cylinder. The size and dimensions of the first body and the size and dimensions of the cylindrical gap are such that an annular recess is formed in between said inner jacket and said outer jacket. Hence, in between said inner jacket and said outer jacket a substantially annular recess is formed. Said recess may have a nominal width of at least a few dozen millimeters, or even a few dozen micrometers.

The axial alignment assembly as defined herein also comprises a plurality of resilient elements that are positioned within said annular recess. These resilient elements may in principle have any geometry as long as at least one dimension of these resilient elements exceeds the nominal size of the annular recess. In a practical embodiment, the resilient elements are substantially spherical, wherein a diameter of the spherical resilient elements exceeds the nominal size, i.e. the distance between the inner jacket and the outer jacket, of the annular recess. As defined herein, each of the plurality of resilient elements is in contact with said outer jacket of said first body and with said inner jacket of said second body. The resilient elements exert a force onto said outer jacket and onto said inner jacket, and due to this the first alignment axis and said second alignment axis are aligned, thus aligning the first body with the second body.

The use of resilient elements in an annular recess formed by an outer cylindrical jacket and an inner cylindrical jacket ensures a good centering, i.e. axial alignment, of the two bodies despite of large dimension and geometry deviations that may occur in the two bodies and the resilient elements.

It is noted that an axial alignment assembly that uses plastic balls is known from NL10257037C in name of applicant. In this disclosure, two bodies that need to be aligned are provided with corresponding V-shaped annular grooves. The two bodies are directed to each other in such a way that the V-shaped annular grooves of the two bodies form a substantially rectangular annular groove having four abutment surfaces. By providing the plastic balls in the groove and pressing the two bodies towards each other, using a clamping force for example, the spherical balls come into contact with each of the four abutment surfaces of the annular groove, and axial alignment of the two bodies is ensured.

One of the disadvantages of this known axial alignment assembly is that this V-groove design requires the two bodies to be 'pulled together'. The two bodies need to be fixed to each other, and the plastic balls need to be squeezed onto the four abutment surfaces for the alignment assembly to be able to work. The clamping force to deform the balls is considerable. One option to reduce the clamping force is to use "softer" balls, i.e. balls that can be compressed more easily, but this has as a negative side effect that it also decrease the force that is used to align the two bodies.

In the axial alignment assembly as defined herein, use is made of the outer jacket and the inner jacket for forming an annular recess in which the resilient elements are provided. This has advantages over the alignment assembly as described in NL10257037C, as the axial alignment assembly according to the present invention does not require the presence of four abutment surfaces, and does not require the use of an axial clamping force. With this, an improved axial alignment assembly is provided that additionally is able to provide tolerances of about 1 μm. With this, the object of the invention is achieved.

Further advantageous embodiments will be described below.

In an embodiment, the resilient elements comprise substantially spherical elements. By using spherical elements, the need to orient the resilient elements in the right way is alleviated, in particular in case the spherical resilient elements have substantially isotropic resiliency properties. The spherical elements can be produced with good dimension tolerances. Additionally, the use of a spherical element allows the resilient elements to roll within the annular recess, leading to minimal (down to zero) tangential residual forces on the resilient elements, which aids in the axial alignment properties.

In an embodiment, the dimension and the number of resilient elements is adapted to the diameter of the outer jacket of the first body. Preferably, the number of resilient elements is as high as possible, but the dimension of the resilient element should not be too small as this increases the required tolerances for all components (first body, second body and resilient elements). The dimension of the resilient element may be in the range of 1% to 10% of the radius of the first body, and preferably at approximately 5%. This ratio ensures that approximately 125 resilient elements can be fitted about the outer cylindrical jacket of the first body. As an example, the first body may have a radius of approximately 100 mm, and a total of 120 spherical resilient elements with a diameter of approximately 4 mm. In this case, the ratio is (4/100=)4%.

In an embodiment, a coil spring is provided with windings that make up the resilient elements. The coil spring may provide a way of easier assembly of the axial alignment assembly as fewer parts need to be installed.

In an embodiment, the resilient elements are composed of a plastic material, such as polyoxymethylene. As an alternative, rubber elements could be used as well.

In an embodiment, the first body has a first abutting surface, and the second body has a second abutting surface that is connected to said first abutting surface in a connected state of the axial alignment assembly. The first abutting surface comprises a normal that may be directed substantially parallel to the first alignment axis. The second abutting surface comprises a normal that may be directed substantially parallel to the second alignment axis. The normal of the first body and the normal of the second body are directed in opposite directions.

In an embodiment, at least one of the first abutting surface and the second abutting surface has a surface normal with a component parallel to said first alignment axis and/or second alignment axis. The first abutting surface may be substantially orthogonal with respect to the outer cylindrical jacket of the first body. The second abutting surface may be substantially orthogonal with respect to the cylindrical inner jacket. Thus, at least one of the first abutting surface and the second abutting surface is positioned orthogonal with respect to the outer jacket and/or inner jacket.

In an embodiment, the axial alignment assembly comprises a holder for holding the plurality of resilient elements. The holder can be provided in the recess that is formed in between the outer cylindrical jacket and the inner cylindrical jacket. The holder enables effective manufacturing of the axial assembly, as it allows pre-fabrication of the holder with the plurality of resilient elements. The holder with resilient elements may then be inserted in between the first body and the second body. As an alternative, the holder can be placed next to the inner cylindrical jacket of the second body, and the first body can be positioned in place.

In an embodiment, the holder comprises a cage for enclosing said resilient elements, in particular in a direction parallel to said alignment axis.

According to an aspect, a charged particle microscope is provided, comprising an axial alignment assembly as defined herein.

In an embodiment, said first body is a pole piece of a lens.

According to an aspect, a method of axially aligning a first body and a second body is provided, wherein said method comprises the steps of:

providing a first body comprising a substantially cylindrical outer jacket, and having a first alignment axis;

providing a second body comprising a substantially cylindrical inner jacket, and having a second alignment axis; and providing a plurality of resilient elements;

wherein the method comprises the further steps of:

positioning said second body with respect to said first body in such a way that said inner jacket faces said outer jacket and in between said inner jacket and said outer jacket a substantially annular recess is formed; and positioning said plurality of resilient elements in said annular recess such that each resilient element is in contact with said outer jacket of said first body and with said inner jacket of said second body and exerts a force onto said outer jacket and onto said inner jacket for aligning said first alignment axis and said second alignment axis.

It is noted that the method steps as defined herein may be permutated in a variety of ways. The steps as described above do not necessarily need to be performed in the stated order. The positioning of the first body, second body and resilient elements may include:

Positioning the first body first, then the second body, and finally the resilient elements;

Positioning the first body first, then the resilient elements, and finally the second body;

Positioning the second body first, then the first body, and finally the resilient elements;

Positioning the second body first, then the resilient elements, and finally the first body;

Positioning the resilient elements first, then the first body, and finally the second body;

Positioning the resilient elements first, then the second body, and finally the first body;

In an embodiment, the method comprises the step of providing a holder for holding said plurality of resilient elements, and positioning said plurality of resilient elements in said holder. As defined before, the step of providing a holder can be done in a number of ways. For example, the plurality of resilient elements is positioned in said holder before the combination of holder and resilient elements is brought into contact with either one of the first body or the second body.

In an embodiment, said plurality of resilient elements is brought into contact with one of the outer jacket and the inner jacket first, and into contact with the other one of the outer jacket and the inner jacket later.

In an embodiment, the method may comprise the step of moving said first body relative to said second body in a direction mainly parallel to said first and second alignment axis.

Turing to FIG. 1 (not to scale), a highly schematic depiction of an embodiment of a charged-particle microscope M according to an embodiment of the invention is shown. More specifically, it shows an embodiment of a transmission-type microscope M, which, in this case, is a TEM/STEM (though, in the context of the current invention, it could just as validly be a SEM (see FIG. 2), or an ion-based microscope, for example). In FIG. 1, within a vacuum enclosure 2, an electron source 4 produces a beam B of electrons that propagates along an electron-optical axis B' and traverses an electron-optical illuminator 6, serving to direct/focus the electrons onto a chosen part of a specimen S (which may, for example, be (locally) thinned/planarized). Also depicted is a deflector 8, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction) (and/or allows scanning motion to be performed, as an alternative to beam scanning). If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX or EDS (Energy-Dispersive X-Ray Spectroscopy) module, for instance; in such a case, an image could be constructed using basically the same principle as in a SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:

TEM camera 30. At camera 30, the electron flux can form a static image (or diffractogram) that can be processed by controller/processor 20 and displayed on a display device 14, such as a flat panel display, for example. When not required, camera 30 can be retracted/withdrawn (as schematically indicated by arrows 30') so as to get it out of the way of axis B'.

STEM camera 32. An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

In the embodiment shown, the microscope M further comprises a retractable X-ray Computed Tomography (CT) module, generally indicated by reference 40. In Computed Tomography (also referred to as tomographic imaging) the source and (diametrically opposed) detector are used to look through the specimen along different lines of sight, so as to acquire penetrative observations of the specimen from a variety of perspectives.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

Figure 2:
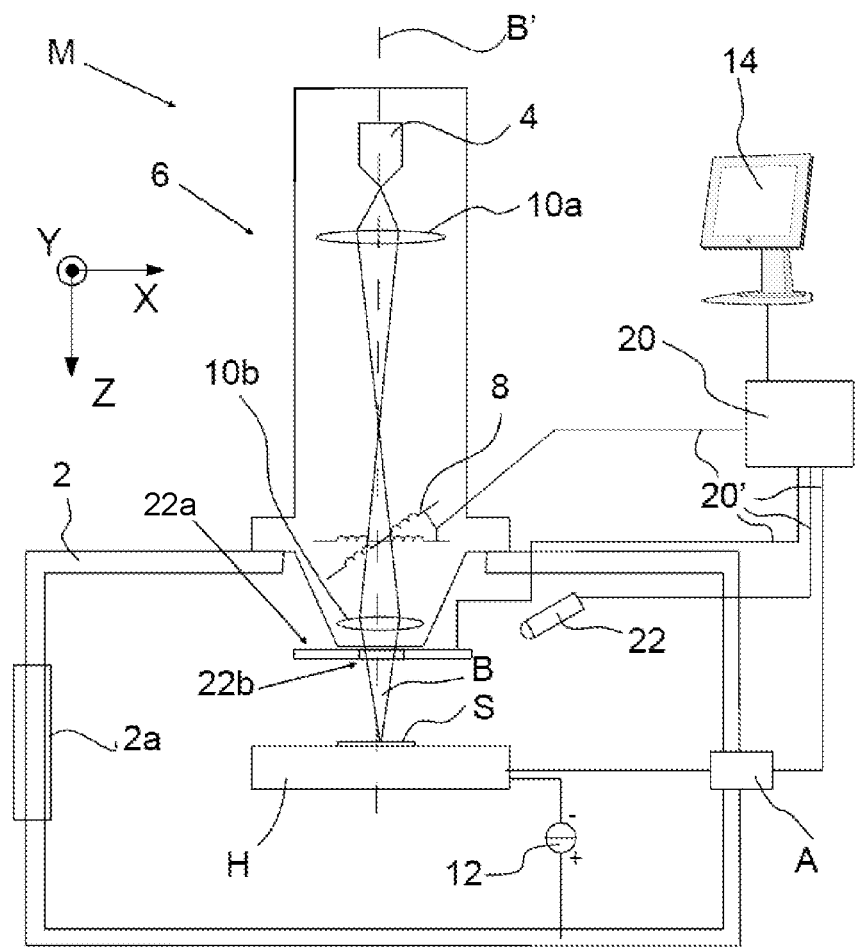
FIG. 2—shows a longitudinal cross-sectional view of a charged particle microscope according to a second embodiment of the invention.

Now referring to FIG. 2, another embodiment of an apparatus according to the invention is shown. FIG. 2 (not to scale) is a highly schematic depiction of a charged-particle microscope M according to the present invention; more specifically, it shows an embodiment of a non-transmission-type microscope M, which, in this case, is a SEM (though, in the context of the current invention, it could just as validly be an ion-based microscope, for example). In the Figure, parts which correspond to items in FIG. 1 are indicated using identical reference symbols, and will not be separately discussed here. Additional to FIG. 1 are (inter alia) the following parts:

2a: A vacuum port, which may be opened so as to introduce/remove items (components, specimens) to/from the interior of vacuum chamber 2, or onto which, for example, an ancillary device/module may be mounted. The microscope M may comprise a plurality of such ports 2a, if desired;

10a, 10b: Schematically depicted lenses/optical elements in illuminator 6;

12: A voltage source, allowing the specimen holder H, or at least the specimen S, to be biased (floated) to an electrical potential with respect to ground, if desired;

14: A display, such as a FPD or CRT;

22a, 22b: A segmented electron detector 22a, comprising a plurality of independent detection segments (e.g. quadrants) disposed about a central aperture 22b (allowing passage of the beam B). Such a detector can, for example, be used to investigate (the angular dependence of) a flux of output (secondary or backscattered) electrons emerging from the specimen S.

Several components of the charged particle microscope shown in FIG. 1 and FIG. 2 need to be axially aligned. But in general, it may be required that two or more components need to be axially aligned. To this end, the disclosure provides an axial alignment assembly.

Now turning to FIG. 3, it is shown an assembly 100 of a first substantially cylindrical body 101 having a first axial alignment axis A1, and a second substantially cylindrical body 201 having a second axial alignment axis A2. It is noted that the first body 101 and the second body 201 do not necessarily have to be cylindrical. As defined herein, the first body 101 comprises a substantially cylindrical outer jacket 103, and having a first alignment axis A1. The first body 101 may have, as shown in FIG. 3, a central bore 104, although in view of the present disclosure a first body that is substantially solid is conceivable as well. The second body 201 as defined herein comprised a substantially cylindrical inner jacket 203, and has a second alignment axis A2. The second body 201 has, in the embodiment shown, an annular protrusion 202 that extends towards the second alignment axis A2. This annular protrusion 202 allows the first body 101 to rest onto the protrusion of the second body 201, as will be explained in more detail with respect to FIG. 4b. Still referring to FIG. 3, it can be seen that the second body 201 is positioned with respect to said first body 101 in such a way that said inner jacket 203 faces said outer jacket 103. In between said inner jacket 103 and said outer jacket 203 a substantially annular recess 401 is formed. It can be seen in FIG. 3 that the first axis A1 is misaligned with respect to the second axis A2. The dimensions of the annular recess are smaller on the right-hand-side of the FIG. 3; and are slightly wider on the left-hand-side of FIG. 3. Alignment of these two bodies poses a challenge.

Now turning to FIG. 4a, it can be seen that the first body 101 and the second body 201 can be aligned with respect to their alignment axes A1, A2, by providing a plurality of resilient elements 301, 302 that are positioned within said annular recess 401. Each of the plurality of resilient elements 301, 302 is in contact with said outer jacket 103 of said first body 101 and with said inner jacket 203 of said second body 201. The resilient elements 301, 302, and the first body 101 and the second body 201 are shaped in such a way that each of the resilient elements 301, 302 exerts a force onto said outer jacket 103 and onto said inner jacket 203 for aligning said first alignment axis A1 and said second alignment axis A2.

It can be seen that in the misaligned state as shown in FIG. 3, the annular recess 401 is smaller on the right-hand-side of the drawing. The annular recess 401 is larger on the left-hand-side of the drawings. By providing a plurality of resilient elements 301, 302 inside the annular recess 401, wherein the resilient elements 301, 302 have a nominal dimension that is substantially the same, resilient elements 302 that are located in the narrow part of the recess 401 will be compressed to a larger extent than resilient elements 301 that are located in the wider part of the recess 401. Due to the larger compression, the resilient elements 302 in the more narrow part of the recess 401 will thus exert a greater force onto the cylindrical jackets 103, 203 compared to the resilient elements 301 in the more wider part of the recess 401. The resulting force will push the first body 101 away from the second body 201 in a direction to the more wider part. Hence, the more narrow part of the recess will become wider, and the more wider part will become more narrower. This balance of forces will continue until the alignment axis A1 of the first body 101 is substantially aligned with the alignment axis A2 of the second body 201, and the alignment axes coincide into a single aligned axis A (as shown in FIG. 4a).

Figure 4B:
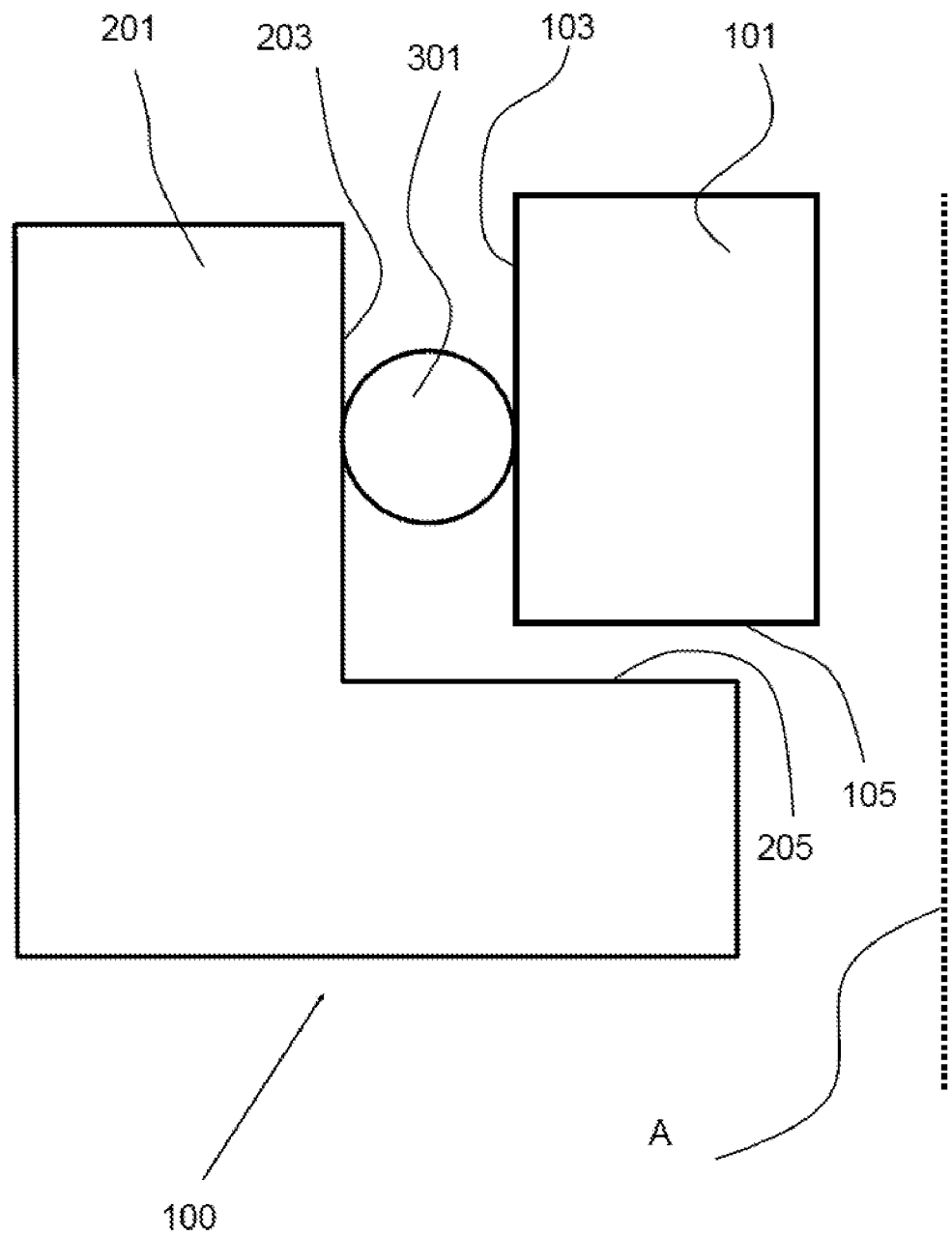

FIG. 4b shows a detail of the axial alignment assembly 100 as shown in FIG. 4a. Here it can be seen that the first body 101 has a first abutment surface 105, and the second body 201 has a second abutment surface 205. The first abutment surface 105 and the second abutment surface 205 are mainly parallel to each other. The first abutment surface 105 and the second abutment surface 205 are mainly orthogonal with respect to the corresponding inner/outer jacket 103, 203 of the first and second body 101, 201. It can be seen in FIG. 4b that the axial alignment assembly as defined herein does not require an axial compression force to be exerted onto the first body 101 and the second body 201. The axial alignment forces is established by the dimensioning of the outer jacket 103, the inner jacket 203, and the resilient elements 301.

It is noted, that the axial alignment assembly 100 as defined herein is explained with respect to cylindrical bodies and an annular recess. It is noted that instead of cylindrical bodies, other orders of rotational symmetry could be applied in the axial alignment assembly as defined herein. For example, triangle, square, polygonal and other shapes are within the scope of the present disclosure, and are considered to be equivalents to the cylindrical bodies described above. In these instances, spherical resilient elements can be used. Applicant reserves the right to file one or more divisionals on these aspects.

It is furthermore noted that the embodiments disclose the use of spherical resilient elements. These are advantageous as they do not need to be aligned in a specific way in order for the elements to work. Other shapes, however, are conceivable as well.

In FIG. 4b, it is noted that the abutment surfaces 105, 205 can be made into contact in a direct manner. As an alternative, a seal element (not shown) can be provided in between the first body 101 and the second body 201, such that the abutment surface 105 of the first body 101 comes into contact with a first side of the seal element, and the abutment surface 205 of the second body 201 comes into contact with the other, second side of the seal element. The seal element may be relatively thin, and can ensure a pressure seal between the inner part of the assembly (located closer to the central axis A) and a part located radially outside of the first body. In an embodiment, the seal element can be made of rubber. In an other embodiment, the seal element can be made of a metal. This is advantageous in case the inner part of the axial alignment assembly (i.e. a space located close to the central axis A) is desired to have a very low pressure, such as a (near) vacuum. The metal seal element is thus able to provide a vacuum seal in the axial alignment assembly as defined herein. This is advantageous when used in charged particle microscopes, as will be explained later.

Now turning to FIG. 5, an alternative embodiment of the axial alignment assembly 100 is shown. It is noted that corresponding elements are identified using corresponding reference signs. The main difference with respect to the axial alignment assembly as shown in FIG. 4a, is the use of a holder 311 for holding the resilient elements 301, 302 in place. The holder 311 may be prepared before assembly of the two bodies 101, 201, by adding the resilient elements 301, 302 to the holder 311. The holder 311 may be a cage for holding spherical resilient elements 301, 302. Other embodiments of holders 311 are conceivable as well.

FIG. 6 shows an embodiment of a part of a charged particle microscope that uses an assembly as defined herein to align a total of three bodies 1101, 1102, 201. Here, the most important alignment is considered to be the alignment of the upper body 1101 and the lower body 1102. The upper body 1101 and the lower body 1102 are, in the embodiment shown in FIG. 6, an upper pole piece 1101 and a lower pole piece 1102, respectively, of a lens for a charged particle microscope, such as a charged particle microscope as shown in FIG. 1 or FIG. 2. The axial alignment assembly 100 as defined herein provides an excellent way of aligning the upper 1101 and lower objective pole 1102 of a TEM.

The required alignment of the upper and lower objective pole piece is in the order of magnitude 1 µm, and this is achievable with the axial alignment assembly as shown in FIG. 6. Here the upper body 1101 is axially aligned with respect to the outer body 201 by using spherical resilient elements 301 in an upper annular recess; and the lower body 1102 is axially aligned with respect to the outer body 201 by using spherical resilient elements 401 in a lower annular recess. This results in the upper body 1101 being axially aligned with the lower body 1102 as well. The resilient elements 301, 401 may be provided in a respective holder 311, 411, such as a cage, as shown in FIG. 6.

Measurements made on the axial alignment assembly as defined herein show that a concentricity of a few microns can be achieved in a relatively easy manner.

As noted before, the axial alignment assembly as defined herein can be used to provide UltraHighVacuum (UHV) specimen chambers. To achieve UHV it is generally agreed that one needs metals seals and baking possibilities. The axial alignment assembly as known from the prior requires the two bodies to be forced towards each other for the axial alignment to be able to take place. Using metal seals would significantly increase the axial compression force needed to obtain the desired axial alignment. In contrast, the axial alignment assembly as defined herein does not require the use of an axial force to obtain the axial alignment, and thus allows the use of metal seals. Using the axial alignment assembly as defined herein, for example with a ball array in a cylindrical gap will not hinder compression of a metal seal between e.g. the pole piece 1101, 1102 and the 'inner objective block' 201. With this, an UHV specimen chamber in a charged particle microscope can be obtained.

Embodiments of the invention have been described above. The desired protection is defined by the appended claims.

The invention claimed is:

1. Axial alignment assembly (100) for aligning modules of a charged particle microscope, comprising:
   a first body (101) comprising a substantially cylindrical outer jacket (103), and having a first alignment axis (A1), wherein said first body is an optical module of the charged particle microscope;
   a second body (201) comprising a substantially cylindrical inner jacket (203), and having a second alignment axis (A2), wherein said second body (201) is positioned with respect to said first body (101) in such a way that said inner jacket (203) faces said outer jacket (103) and in between said inner jacket and said outer jacket a substantially annular recess (401) is formed; and a plurality of substantially spherical resilient elements (301, 302) that are positioned within said annular recess (401), wherein each resilient element (301, 302) is in contact with said outer jacket (103) of said first body (101) and with said inner jacket (203) of said second body (201) and exerts a force onto said outer jacket (103) and onto said inner jacket (203) for aligning said first alignment axis (A1) and said second alignment axis (A2).

2. Axial alignment assembly (100) according to claim 1, wherein said resilient elements (301, 302) have a nominal dimension that is substantially the same, and the nominal dimension exceeds a nominal distance between said outer jacket (103) and said inner jacket (203).

3. Axial alignment assembly (100) according to claim 1, wherein the resilient elements (301, 302) are composed of a plastic material.

4. Axial alignment assembly (100) according to claim 1, wherein the first body has a first abutting surface (105), and wherein the second body has a second abutting surface (205) that is connected to said first abutting surface.

5. Axial alignment assembly (100) according to claim 4, wherein at least one of the first abutting surface (105) and the second abutting surface (205) has a surface normal with a component parallel to said first alignment axis (A1) and/or second alignment axis (A2).

6. Axial alignment assembly (100) according to claim 4, wherein at least one of the first abutting surface (105) and the second abutting surface (205) is positioned orthogonal with respect to the outer jacket (103) and/or inner jacket (203).

7. Axial alignment assembly (100) according to claim 1, wherein the axial alignment assembly (100) comprises a holder (311) for holding the plurality of resilient elements (301, 302).

8. Axial alignment assembly (100) according to claim 7, wherein the holder (311) comprises a cage for enclosing said resilient elements (301, 302), in particular in a direction parallel to said alignment axis (A, A1, A2).

9. Axial alignment assembly (100) according to claim 1, wherein the number of the plurality of resilient elements is more than three.

10. Charged particle microscope comprising an axial alignment assembly (100) according to claim 1.

11. Charged particle microscope according to claim 10, wherein said first body is a pole piece (1101, 1102).

12. Charged particle microscope according to claim 11, wherein said charged particle microscope is a transmission electron microscope, and wherein two pole pieces (1101, 1102) are aligned along said alignment axis (A).

13. Method of axially aligning modules of a charged particle microscope, wherein said method comprises the steps of:
providing a first body (101) comprising a substantially cylindrical outer jacket (103), and having a first alignment axis (A1), wherein said first body is an optical module of the charged particle microscope;
providing a second body (201) comprising a substantially cylindrical inner jacket (203), and having a second alignment axis (A2); and
providing a plurality of resilient elements (301, 302);
wherein the method comprises the further steps of:
positioning said second body (201) with respect to said first body (201) in such a way that said inner jacket (203) faces said outer jacket (103) and in between said inner jacket (203) and said outer jacket (103) a substantially annular recess (401) is formed; and
positioning said plurality of substantially spherical resilient elements (301, 302) in said annular recess (401) such that each resilient element (301, 302) is in contact with said outer jacket (103) of said first body (101) and with said inner jacket (203) of said second body (201) and exerts a force onto said outer jacket (103) and onto said inner jacket (203) for aligning said first alignment axis (A1) and said second alignment axis (A2).

14. Method according to claim 13, comprising the step of providing a holder (311) for holding said plurality of resilient elements (301, 302), and comprising the step of positioning said plurality of resilient elements (301, 302) in said holder (311).

15. Method according to claim 13, wherein said plurality of resilient elements (301, 302) is brought into contact with one of the outer jacket (103) and the inner jacket (203) first, and into contact with the other one of the outer jacket (103) and the inner jacket (203) later.

16. Method according to claim 15, comprising the step of moving said first body (101) relative to said second body (201) in a direction mainly parallel to said first (A1) and second (A2) alignment axis.

17. Method according to claim 1, wherein the multiple resilient elements are positioned at different axial locations within said annular recess.

18. Method according to claim 1, wherein the number of the resilient elements is adapted to the diameter of the outer jacket of the first body.

* * * * *